United States Patent [19]
Kuan

[11] Patent Number: 6,165,806
[45] Date of Patent: Dec. 26, 2000

[54] FAULT ISOLATION WITHIN AN INNER LEAD BOND REGION OF A μBGA (MICRO BALL GRID ARRAY) PACKAGE FOR AN INTEGRATED CIRCUIT DIE

[75] Inventor: Siew Hor Kuan, Penang, Malaysia

[73] Assignee: Advanced Micro Devices, Inc., Sunnyvale, Calif.

[21] Appl. No.: 09/340,221

[22] Filed: Jun. 25, 1999

[51] Int. Cl.$^7$ ............................ G01R 31/26; H01L 21/66; H01L 21/44; H01L 21/48; H01L 21/50
[52] U.S. Cl. ................................ 438/14; 438/106; 29/593
[58] Field of Search .......................... 438/106, 14; 29/593

[56] References Cited

U.S. PATENT DOCUMENTS

| | | |
|---|---|---|
| 5,764,650 | 6/1998 | Debenham . |
| 6,025,728 | 2/2000 | Hembree et al. . |
| 6,033,937 | 3/2000 | Manteghi . |

*Primary Examiner*—John F. Niebling
*Assistant Examiner*—Josetta Jones
*Attorney, Agent, or Firm*—Monica H. Choi

[57] ABSTRACT

The present invention efficiently isolates a fault in an inner lead bond region of a μBGA (micro-Ball Grid Array) package for holding an integrated circuit die, while preserving the structural integrity of areas of the μBGA package outside of the inner lead bond region. The method of the present invention includes a step of immersing the inner lead bond region of the μBGA package into a dissolving bath to dissolve the seal material covering beam leads within the inner lead bond region. The method of the present invention also includes a step of washing the inner lead bond region of the μBGA package in a cleaning bath to remove acid and to remove dissolved seal material from the beam leads within the inner lead bond region. The inner lead bond region is then inspected after the seal material is sufficiently removed from the beam leads within the inner lead bond region to isolate any fault on the beam leads within the inner lead bond region. The present invention may be used to particular advantage for isolating any open circuit faults within the inner lead bond region of the μBGA package when the inner lead bond region of the μBGA package is viewed using SEM (Scanning Electron Microscopy) after the seal material is sufficiently removed from the beam leads within the inner lead bond region.

14 Claims, 4 Drawing Sheets

6,165,806

FAULT ISOLATION WITHIN AN INNER LEAD BOND REGION OF A μBGA (MICRO BALL GRID ARRAY) PACKAGE FOR AN INTEGRATED CIRCUIT DIE

TECHNICAL FIELD

The present invention relates generally to fault isolation techniques for integrated circuit die packages, and more particularly, to a mechanism for fault isolation within an inner lead bond region of a μBGA (micro-Ball Grid Array) package that holds an integrated circuit die.

BACKGROUND OF THE INVENTION

Referring to FIG. 1, a top view of a μBGA (micro-Ball Grid Array) package 102 shows that the μBGA package 102 holds an integrated circuit die 104. The μBGA package 102 provides connection to nodes within the integrated circuit die 104 via bond pads on the integrated circuit die 104 to a solder ball of the μBGA package 102. A μBGA package includes an array of solder balls for providing connection to a plurality of nodes within the integrated circuit die 104. The μBGA package 102 of FIG. 1 shows an array of just two rows by two columns of solder balls for clarity of illustration. However, a typical μBGA package has an array of many more solder balls, as known to one of ordinary skill in the art of electronics.

Referring to FIG. 1, a first solder ball 106 of the μBGA package 102 is coupled to a first bond pad 108 on the integrated circuit die 104. A first beam lead 110 is connected to the first bond pad 108, and a first metal interconnect 112 such as a copper interconnect is coupled between the first beam lead 110 and the first solder ball 106. Similarly, a second solder ball 114 of the μBGA package 102 is coupled to a second bond pad 116 on the integrated circuit die 104. A second beam lead 118 is connected to the second bond pad 116, and a second metal interconnect 120 such as a copper interconnect is coupled between the second beam lead 118 and the second solder ball 114. In addition, a third solder ball 122 of the μBGA package 102 is coupled to a third bond pad 124 on the integrated circuit die 104. A third beam lead 126 is connected to the third bond pad 124, and a third metal interconnect 128 such as a copper interconnect is coupled between the third beam lead 126 and the third solder ball 122. Furthermore, a fourth solder ball 130 of the μBGA package 102 is coupled to a fourth bond pad 132 on the integrated circuit die 104. A fourth beam lead 134 is connected to the fourth bond pad 132, and a fourth metal interconnect 136 such as a copper interconnect is coupled between the fourth beam lead 134 and the fourth solder ball 130.

Referring to FIG. 2, a cross sectional view of an example beam lead and solder ball across the line A—A of FIG. 1 is shown. Elements having the same reference number in FIGS. 1 and 2 refer to elements having similar structure and function. The beam lead 134 forms an S-structure near the bond pad 132 of the integrated circuit die 104 to make contact with the bond pad 132. The copper interconnect 136 is deposited on the beam lead 134 to provide connection of the beam lead 134 to the solder ball 130. A polyimide material 150 is deposited on the copper interconnect 136 to encapsulate and protect the copper interconnect 136. Furthermore, a seal material 152, such as an elastomer seal, surrounds the beam lead 134 to encapsulate and protect the beam lead 134. A region of the μBGA package 102 where each of at least one beam lead makes contact to a respective bond pad is referred to as an inner lead bond region 160 (shown within dashed lines in FIGS. 1 and 2).

Any integrated circuit package, including a μBGA package, is tested for proper functionality of the integrated circuit die within that integrated circuit package. When the integrated circuit die within the integrated circuit package is not functioning properly, the mechanism causing the functional failure is determined through fault isolation techniques such that appropriate corrective measures may be taken to prevent such functional failure in other integrated circuit packages.

Referring to FIG. 2, the mechanism causing the functional failure of the integrated circuit die 104 within a μBGA package may be due to faults within the inner lead bond region 160. For example, the beam lead 134 may not be properly connected to the bond pad 132 to result in an open circuit fault within the inner lead bond region 160. Because of the unique structural details within the inner lead bond region 160 of a μBGA package, a fault isolation technique is desired for efficiently isolating any fault within the inner lead bond region 160 of the μBGA package.

In addition, the mechanism causing the functional failure of the integrated circuit die 104 within a μBGA package may be due to faults in areas of the μBGA package outside of the inner lead bond region 160. Thus, the fault isolation technique for isolating any fault within the inner lead bond region 160 desirably preserves the structural integrity of the areas of the μBGA package outside of the inner lead bond region 160 for later inspection of those areas.

SUMMARY OF THE INVENTION

Accordingly, a primary object of the present invention is to efficiently isolate a fault in an inner lead bond region of a μBGA (micro-Ball Grid Array) package for holding an integrated circuit die, while preserving the structural integrity of areas of the μBGA package outside of the inner lead bond region.

The inner lead bond region of the μBGA package includes beam leads with each beam lead connecting a respective bond pad on the integrated circuit die to a respective solder ball. The beam leads are encapsulated within a seal material, such as elastomer seal, in the inner lead bond region of the μBGA package.

Generally, the method of the present invention includes a step of immersing the inner lead bond region of the μBGA package into a dissolving bath to dissolve the seal material covering the beam leads within the inner lead bond region. The method of the present invention also includes a step of washing the inner lead bond region of the μBGA package in a cleaning bath to remove acid and to remove dissolved seal material from the beam leads within the inner lead bond region. The inner lead bond region is then inspected after the seal material is sufficiently removed from the beam leads within the inner lead bond region to isolate any fault around the beam leads within the inner lead bond region.

In one embodiment of the present invention, the μBGA package is attached to an immersing rod, and the immersing rod is lowered into the dissolving bath until the inner lead bond region of the μBGA package is immersed within the dissolving bath.

The present invention may be used to particular advantage for isolating any open circuit faults within the inner lead bond region of the μBGA package when the inner lead bond region of the μBGA package is viewed using SEM (Scanning Electron Microscopy) after the seal material is sufficiently removed from the inner lead bond region.

In this manner, the seal material within the inner lead bond region of the μBGA package may be removed in approximately two minutes to ten minutes. Thus, the present invention is an efficient technique for isolating a fault within the inner lead bond region of the μBGA package. In addition, each beam lead has polyimide material deposited on a respective portion of the beam lead, and the dissolving bath does not etch the polyimide material from the beam lead. Thus, the process of the present invention preserves the structural integrity of areas of the μBGA package outside of the inner lead bond region for later inspection of those areas.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9 and 10 refer to elements having similar structure and function.

DETAILED DESCRIPTION

Figure 1:
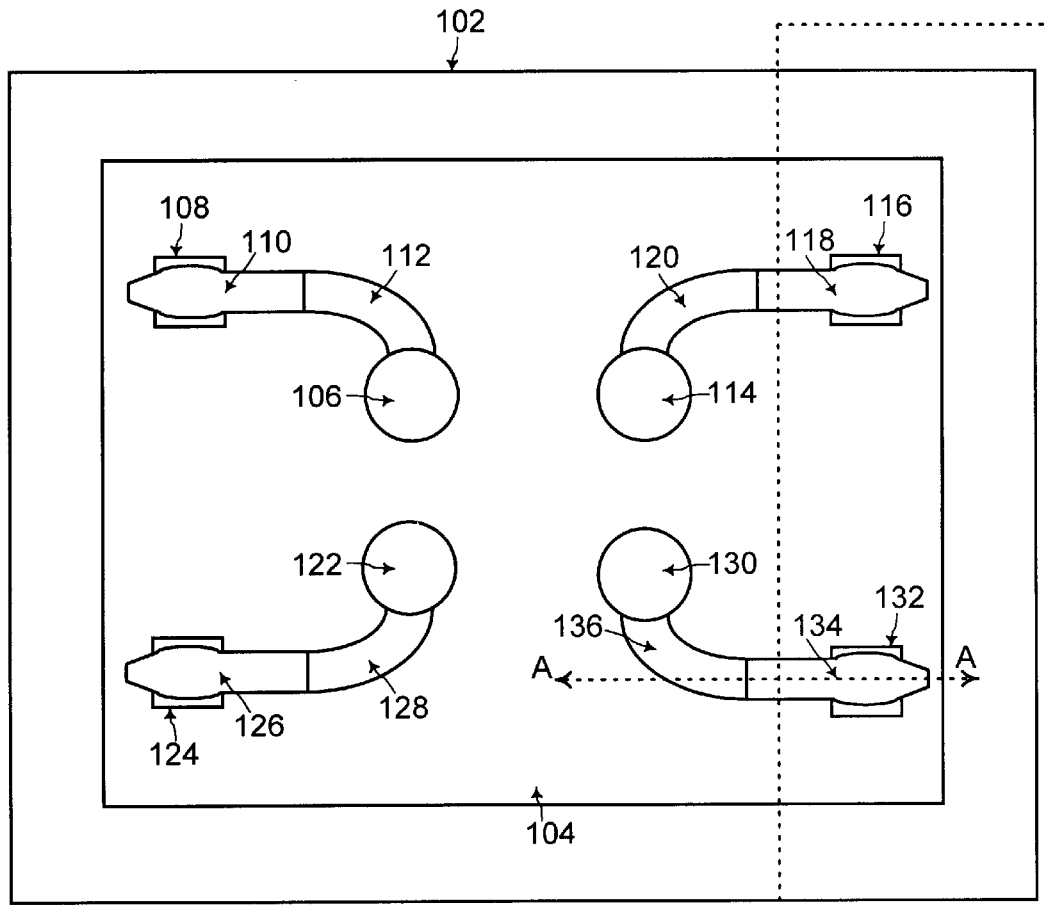
FIG. 1 shows a top view of an example μBGA package.
Figure 2:
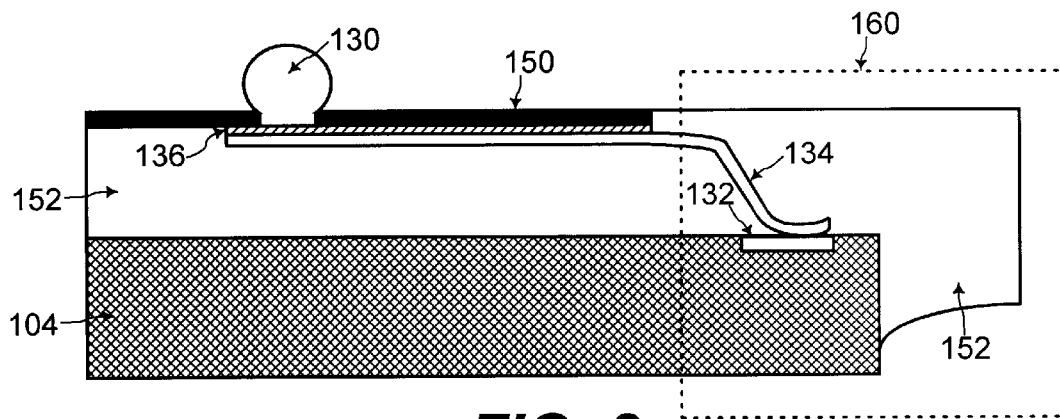
FIG. 2 shows a cross sectional view of an example beam lead and bond pad structure within an inner lead bond region of the μBGA package of FIG. 1.

Referring to FIGS. 1 and 2, the present invention efficiently isolates a fault in the inner lead bond region 160 of the μBGA package 102 that holds the integrated circuit die 104, while preserving the structural integrity of areas of the μBGA package outside of the inner lead bond region 160. More particularly, the present invention isolates a fault around a beam lead and bond pad structure within the inner lead bond region 160. The seal material 152 encapsulating the beam leads within the inner lead bond region 160 is sufficiently removed such that the beam leads within the inner lead bond region 160 may be accurately inspected.

Figure 3:
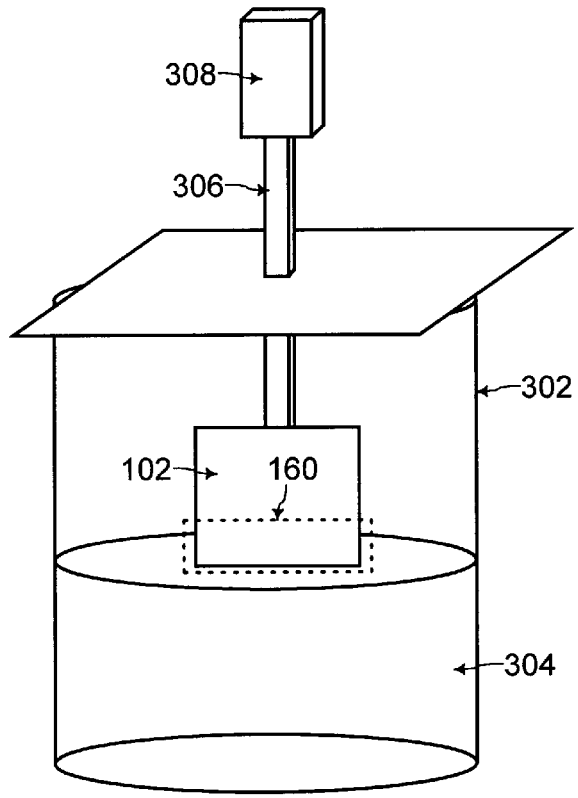
FIG. 3 illustrates the immersion of the inner lead bond region of a μBGA package into a dissolving bath to dissolve any seal material from the inner lead bond region, according to the present invention.

Referring to FIG. 3, a container 302 such as a beaker holds a dissolving bath 304. The dissolving bath is comprised of a solution that is amenable for dissolving the seal material 152, which may be an elastomer seal for example, within the inner lead bond region 160 of the μBGA package 102. The dissolving bath 304 may be comprised of concentrated acid such as 98% sulfuric acid or of a reactive acid solution, as known to one of ordinary skill the art. However, any type of solution that is amenable for dissolving the seal material 152 within the inner lead bond region 160 of the μBGA package 102 may be used in the dissolving bath 304 of the present invention.

The μBGA package 102 is attached to an immersing rod 306. For example, the μBGA package 102 may be attached to the immersing rod 306 by adhesive tape. The immersing rod 306 having the μBGA package 102 attached thereon is lowered by a rod handle 308 until the inner lead bond region 160 of the μBGA package 102 is immersed within the dissolving bath 304. In one embodiment of the present invention, the inner lead bond region 160 of the μBGA package 102 is immersed within the dissolving bath 304 for approximately two minutes when the dissolving bath is comprised of 98% sulfuric acid at room temperature or of a reactive form of sulfuric acid at room temperature, such as sulfuric acid fuming of 20% as known to one or ordinary skill in the art of integrated circuit fabrication processes. During such an immersion of the inner lead bond region 160 of the μBGA package 102 into the dissolving bath 304, the seal material 152 encapsulating the beam leads within the inner lead bond region 160 is dissolved by the dissolving bath 304.

Figure 4:
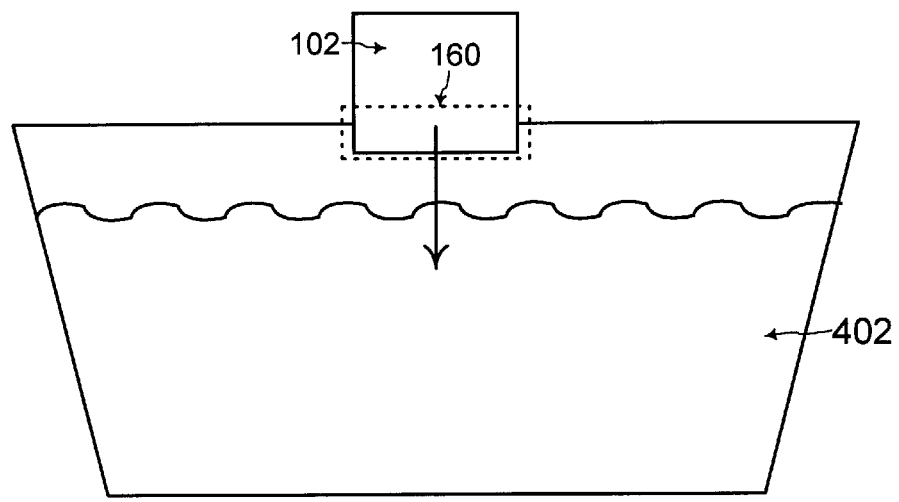
FIG. 4 illustrates the washing of the μBGA package of FIG. 3 after the inner lead bond region of the μBGA package has been immersed in the dissolving bath, according to the present invention.

Referring to FIG. 4, after the immersion of the inner lead bond region 160 of the μBGA package 102 into the dissolving bath 304, the μBGA package 102 is washed in a cleaning bath 402. This washing of the μBGA package 102 removes the acid and the dissolved seal material 152 from the μBGA package 102 including especially from the beam leads within the inner lead bond region 160 of the μBGA package 102. The cleaning bath 402 may be comprised of any liquid that is amenable for removing acid and the dissolved seal material 152 from the inner lead bond region 160 of the μBGA package 102.

In one embodiment of the present invention, the cleaning bath 402 is comprised of deionized water. The deionized water is preferably agitated by circulating and vibrating the deionized water within the cleaning bath 402. In addition, ultrasound waves may be generated within the deionized water of the cleaning bath 402 for a thorough cleaning of the inner lead bond region 160 of the μBGA package 102.

Figure 5:
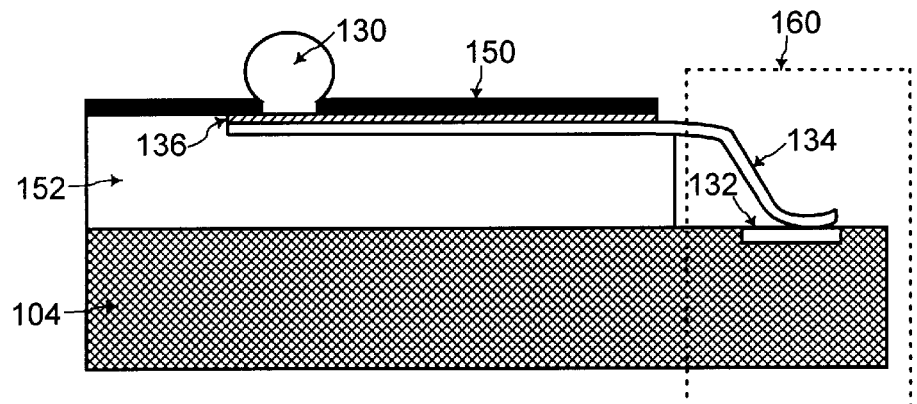
FIG. 5 shows the cross sectional view of a beam lead and bond pad structure within an inner lead bond region of the μBGA package after sufficient removal of the seal material from the inner lead bond region.

Referring to FIG. 5, a cross sectional view of a beam lead and bond pad structure within the inner lead bond region 160 of the μBGA package 102 shows the removal of the seal material 152 after the immersion of the inner lead bond region 160 of the μBGA package 102 into the dissolving bath 304 and washing of the μBGA package 102 in the cleaning bath 402. Comparing FIGS. 2 and 5, the seal material 152 encapsulating the beam lead 134 is sufficiently removed from the beam lead 134 within the inner lead bond region 160 such that the beam lead 134 may be more accurately inspected. If the seal material 152 encapsulating the beam lead 134 is not sufficiently removed from the beam lead 134 after one cycle of immersing the inner lead bond region 160 into the dissolving bath 304 and washing of the μBGA package 102 in the cleaning bath 402, then such a cycle may be repeated until the seal material 152 encapsulating the beam lead 134 is sufficiently removed from the beam lead 134 such that the beam lead 134 may be accurately inspected.

After sufficient removal of the seal material 152 encapsulating the beam leads within the inner lead bond region 160 of the μBGA package 102, the inner lead bond region 160 is inspected to isolate any fault present around the beam leads within the inner lead bond region 160. In one embodiment of the present invention, the beam leads within the inner lead bond region 160 are viewed using SEM (Scanning Electron Microscopy) to isolate any open circuit fault around the beam leads within the inner lead bond region 160.

Figure 6:
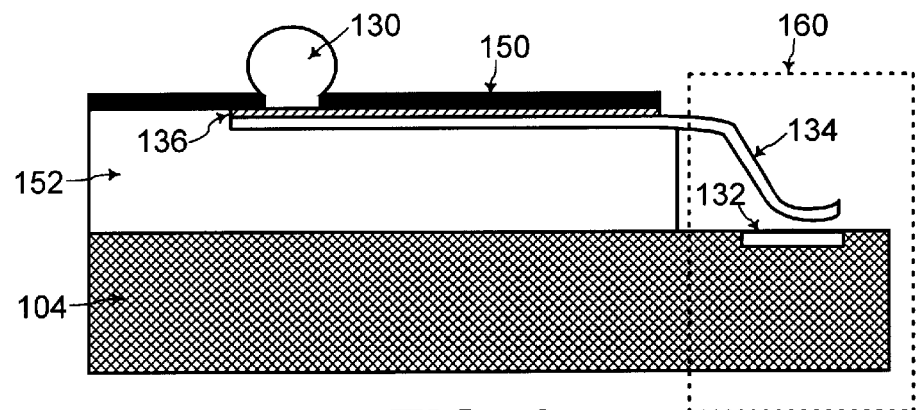
FIG. 6 shows the cross sectional view of a beam lead and bond pad structure within an inner lead bond region of the μBGA package having an open circuit fault from the beam lead not making contact with the bond pad on the integrated circuit die.
Figure 7:
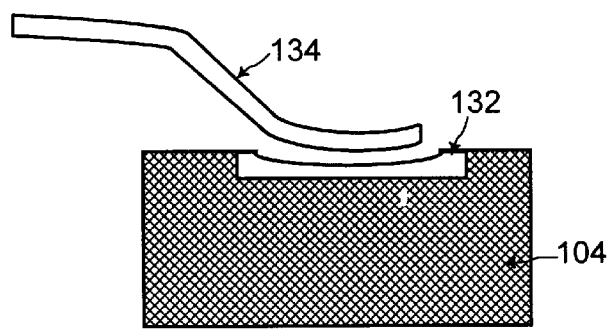
FIG. 7 shows the cross sectional view of a beam lead and bond pad structure within an inner lead bond region of the μBGA package having an open circuit fault from cratering of the bond pad below the beam lead.
Figure 8:
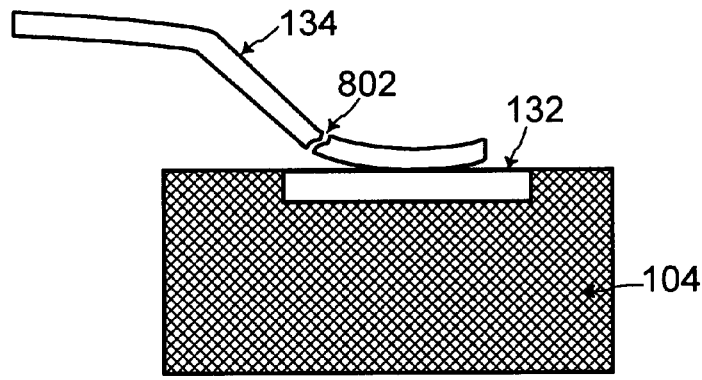
FIG. 8 shows the cross sectional view of a beam lead and bond pad structure within an inner lead bond region of the μBGA package having an open circuit fault from the beam lead having a broken heel.
Figure 9:
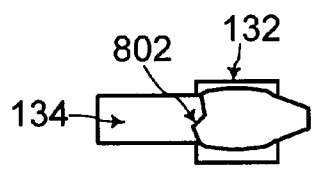
FIG. 9 shows a top view of the beam lead and bond pad structure of FIG. 8 with the open circuit fault from the beam lead having the broken heel.
Figure 10:
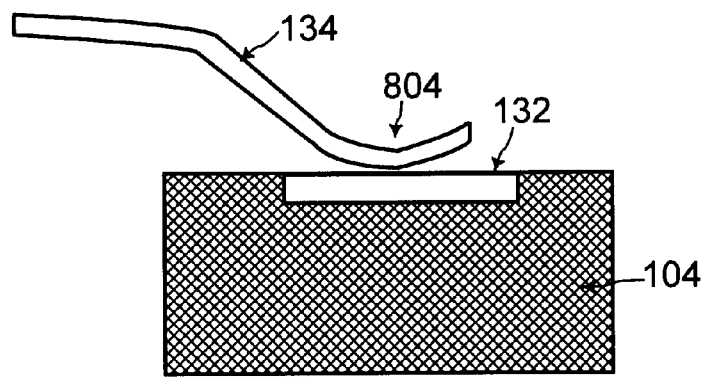
FIG. 10 shows the cross sectional view of a beam lead and bond pad structure within an inner lead bond region of the μBGA package having an open circuit fault from a tight S-loop of the beam lead.

Referring to FIG. 6, for example, an open circuit fault may occur when the beam lead 134 within the inner lead bond region 160 does not make contact with the bond pad 132 on the integrated circuit die 104 because the beam lead 134 is not positioned properly with respect to the position of the bond pad 132. Referring to FIG. 7, for another example, an open circuit fault may occur from a cratering of the bond pad 132 below the beam lead 134 such that the beam lead 134 does not make contact to the bond pad 132. Referring to FIG. 8, an open circuit fault may occur from a broken heel 802 of the beam lead 134. FIG. 9 shows a top view of the beam lead 134 with the broken heel 802. Referring to FIG. 10, an open circuit fault may occur from a tight S-loop 804 of the beam lead 134 near the bond pad 132 such that the beam lead 134 does not make sufficient contact with the bond pad 132.

In this manner, the present invention efficiently isolates a fault around the beam lead and bond pad of the inner lead bond region 160 of a μBGA package. The seal material 152 encapsulating the beam leads within the inner lead bond region 160 is sufficiently removed in approximately two minutes to approximately ten minutes such that the beam leads within the inner lead bond region 160 of the μBGA package may be inspected efficiently.

In addition, the mechanism causing the functional failure of the integrated circuit die 104 within a μBGA package may be due to a fault in an area of the μBGA package outside of the inner lead bond region 160 of the μBGA package. Referring to FIG. 5, the method of the present invention for dissolving the seal material 152 from the inner lead bond region 160 preserves the polyimide material 150 such that the structural integrity of the copper interconnect 136 is preserved. Thus, the fault isolation technique of the present invention for isolating any fault within the inner lead bond region 160 preserves the structural integrity of the areas of the μBGA package outside of the inner lead bond region 160 for later inspection of those areas.

The foregoing is by way of example only and is not intended to be limiting. For example, the μBGA package 102 of FIG. 1 is by way of example, and a μBGA package may have various other configurations with more numerous solder balls and beam leads, as known to one of ordinary skill in the art.

In addition, any type of solution that is amenable for dissolving the seal material 152 from the inner lead bond region 160 of the μBGA package 102 may be used for the dissolving bath 304 of the present invention, as would be apparent to one of ordinary skill in the art from the description herein. Also, any type of solution that is amenable for cleaning the μBGA package 102 to remove the dissolved seal material from the inner lead bond region 160 of the μBGA package 102 may be used for the cleaning bath 402 of the present invention, as would be apparent to one of ordinary skill in the art from the description herein.

Furthermore, the immersing rod mechanism of FIG. 3 is by way of example only for immersing the inner lead bond region 160 of the μBGA package 102 within the dissolving bath 302. Any other type of mechanism for immersing the inner lead bond region 160 of the μBGA package 102 within the dissolving bath 302 may be used with the present invention, as would be apparent to one of ordinary skill in the art from the description herein.

The present invention is limited only as defined in the following claims and equivalents thereof.

I claim:

1. A method for isolating a fault in an inner lead bond region of a μBGA (micro-Ball Grid Array) package for holding an integrated circuit die, said inner lead bond region including at least one beam lead with each beam lead coupling a respective bond pad on said integrated circuit die to a respective solder ball, and said at least one beam lead being encapsulated with a seal material within said inner lead bond region, the method including the steps of:

A. immersing said inner lead bond region of said μBGA package into a dissolving bath to dissolve said seal material covering said at least one beam lead within said inner lead bond region;

B. washing said inner lead bond region of said μBGA package in a cleaning bath to remove acid and to remove dissolved seal material from said at least one beam lead within said inner lead bond region; and C. inspecting said inner lead bond region after said seal material is sufficiently removed from said at least one beam lead within said inner lead bond region to isolate said fault on said at least one beam lead within said inner lead bond region.

2. The method of claim 1, further including the step of:
   attaching said μBGA package to an immersing rod and lowering said immersing rod into said dissolving bath until said inner lead bond region of said μBGA package is immersed within said dissolving bath.

3. The method of claim 1, wherein said dissolving bath is comprised of approximately 98% sulfuric acid at room temperature.

4. The method of claim 3, wherein said step A further includes the step of:
   immersing said inner lead bond region of said μBGA package into said dissolving bath for approximately 2 minutes.

5. The method of claim 1, wherein said cleaning bath is comprised of agitated deionized water.

6. The method of claim 5, wherein said agitated deionized water has ultrasound waves generated therein.

7. The method of claim 1, further including the step of:
   repeating steps A and B until said seal material is sufficiently removed from said at least one beam lead within said inner lead bond region.

8. The method of claim 1, wherein said step C further includes the step of:
   viewing said at least one beam lead within said inner lead bond region using SEM (Scanning Electron Microscopy) to isolate any open circuit fault for said at least one beam lead within said inner lead bond region.

9. The method of claim 8, wherein said open circuit fault is from a beam lead not making contact with a respective bond pad on said integrated circuit die.

10. The method of claim 8, wherein said open circuit fault is from a beam lead having a broken heel.

11. The method of claim 8, wherein said open circuit fault is from a tight S-loop of a beam lead.

12. The method of claim 8, wherein said open circuit fault is from cratering of a respective bond pad below a beam lead.

13. The method of claim 1, wherein each of said at least one beam lead has polyimide material deposited on a respective portion of each of said at least one beam lead, and wherein said dissolving bath does not etch said polyimide material from each of said at least one beam lead.

14. A method for isolating a fault in an inner lead bond region of a µBGA (micro-Ball Grid Array) package for holding an integrated circuit die, said inner lead bond region including at least one beam lead with each beam lead coupling a respective bond pad on said integrated circuit die to a respective solder ball, and said at least one beam lead being encapsulated with a seal material within said inner lead bond region, the method including the steps of:

A. attaching said µBGA package to an immersing rod;

B. lowering said immersing rod into a dissolving bath until said inner lead bond region of said µBGA package is immersed within said dissolving bath for approximately 2 minutes, to dissolve said seal material covering said at least one beam lead within said inner lead bond region;

and wherein said dissolving bath is comprised of approximately 98% sulfuric acid at room temperature;

C. washing said inner lead bond region of said µBGA package in a cleaning bath to remove acid and to remove dissolved seal material from said at least one beam lead within said inner lead bond region, and wherein said cleaning bath is comprised of agitated deionized water, and wherein said agitated deionized water has ultrasound waves generated therein;

D. repeating steps B and C until said seal material is sufficiently removed from said at least one beam lead within said inner lead bond region; and E. inspecting said inner lead bond region after said seal material is sufficiently removed from said at least one beam lead within said inner lead bond region to isolate said fault on said at least one beam lead within said inner lead bond region, said step E further including the step of:

viewing said at least one beam lead within said inner lead bond region using SEM (Scanning Electron Microscopy) to isolate any open circuit fault for said at least one beam lead within said inner lead bond region;

and wherein said open circuit fault is from one of: a beam lead not making contact to a respective bond pad on said integrated circuit die, a beam lead having a broken heel, a tight S-loop of a beam lead, and cratering of a respective bond pad below a beam lead;

and wherein each of said at least one beam lead has polyimide material deposited on a respective portion of each of said at least one beam lead, and wherein said dissolving bath does not etch said polyimide material from each of said at least one beam lead.

* * * * *